United States Patent
Gerbsch et al.

(10) Patent No.: US 7,095,098 B2
(45) Date of Patent: Aug. 22, 2006

(54) ELECTRICALLY ISOLATED AND THERMALLY CONDUCTIVE DOUBLE-SIDED PRE-PACKAGED COMPONENT

(75) Inventors: Erich William Gerbsch, Cicero, IN (US); Ralph S. Taylor, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/946,184

(22) Filed: Sep. 21, 2004

(65) Prior Publication Data
US 2005/0035442 A1 Feb. 17, 2005

Related U.S. Application Data

(62) Division of application No. 10/050,344, filed on Jan. 16, 2002, now Pat. No. 6,812,553.

(51) Int. Cl.
*H01L 23/48* (2006.01)

(52) U.S. Cl. .............. 257/666; 257/E21.499; 257/E23.181; 257/E23.044; 257/692; 257/728; 257/732; 257/782

(58) Field of Classification Search ............... 257/666, 257/692, 691, 728, 732, 578, 584, 673, 782, 257/66, E21.499, E23.181, E23.044; 174/52.4, 174/52 FP
See application file for complete search history.

(56) References Cited

U.S. PATENT DOCUMENTS

| | | | |
|---|---|---|---|
| 4,538,170 A | 8/1985 | Yerman | ........................ 357/80 |
| 4,902,854 A | 2/1990 | Kaufman | |
| 5,767,570 A | 6/1998 | Rostoker | ..................... 257/668 |
| 6,020,636 A | 2/2000 | Adishian | |
| 6,462,413 B1 | 10/2002 | Polese et al. | |
| 6,542,365 B1 | 4/2003 | Inoue | |
| 6,614,659 B1 | 9/2003 | Feigenbaum et al. | |
| 6,670,216 B1 | 12/2003 | Strauch | |
| 6,812,553 B1 * | 11/2004 | Gerbsch et al. | ............. 257/673 |
| 2001/0033477 A1 | 10/2001 | Inoue et al. | ................ 361/718 |
| 2002/0163070 A1 | 11/2002 | Choi | |

* cited by examiner

*Primary Examiner*—Alexander Oscar Williams
(74) *Attorney, Agent, or Firm*—Stefan V. Chmielewski

(57) ABSTRACT

An electrically isolated and thermally conductive double-sided pre-packaged IC component, stamped lead members, drain pads, source pads, gate runner, and a MOSFET, IGBT, etc. are positioned between a pair of ceramic substrate members. Layers of solderable copper material are directly bonded to the inner and outer surfaces of the substrate members.

5 Claims, 3 Drawing Sheets

ELECTRICALLY ISOLATED AND THERMALLY CONDUCTIVE DOUBLE-SIDED PRE-PACKAGED COMPONENT

CROSS-REFERENCE TO RELATED APPLICATIONS

This application is a divisional and claims the benefit of U.S. application Ser. No. 10/050,344 filed 16 Jan. 2002, entitled "Electrically Isolated and Thermally Conductive Double-Sided Pre-Packaged Component," now U.S. Pat. No. 6,812,553 issued 2 Nov. 2004.

TECHNICAL FIELD

The present invention relates to circuit board components and more particularly to electrically isolated and thermally conductive pre-packaged components.

BACKGROUND OF THE INVENTION

There are numerous types of circuit board components in use today, including those which have been specifically developed for high current and high power applications, such as for electrical vehicles. A current component used in these applications is a TO247 package. These devices utilize metalized ceramic substrates, stamped copper leads or lead frames, wire bonds, or solderable topside integrated circuits (ICs). There are a variety of solderable topside packages for use with discreet power devices and integrated circuits. One of these devices utilizes a plastic material to overmold the TO247 package except for the bottom surface. The plastic overmold protects the internal die and wire bonds or bond straps. The bottom surfaces in most instances are electrically attached and thermally conductive. It is typically left open to provide a thermal and electrical path out of the package. This path also allows the end user to connect the package to a heat sinking mass or an electrical bus.

With these prior devices, a heat sink pad must be added in order to achieve electrical isolation. The pad, however, adds thermal resistance to the assembly, typically on the order of 0.1 to 0.5 degrees per C./watt.

SUMMARY OF THE INVENTION

It is an object of the present invention to provide an improved circuit board component for high power and high current applications, such as an improved TO220 type-package. The TO220-type package is one half the size of a TO247 package. It is also an object of the present invention to provide a TO220-type component which has improved thermal performance and electrical isolation. It is a further object of the present invention to provide a TO220-type component which has higher current carrying capabilities than wire bonds and better durability and fatigue strength. It is a still further the present invention to provide a reliable, high current, high power TO220-type device that is pre-packaged and available for use in a variety of applications.

The present invention provides an electrically isolated and thermally conductive double-sided TO220-type component. The invention provides a pre-packaged component which has particular use in high current and high power applications. The component has a pair of ceramic substrates on the top and bottom sides with stamped copper leads or lead frames. Integrated circuit (IC) devices such as discrete transistors, diodes, resistors, etc. are positioned between the ceramic substrates. Solderable bonded device layers are provided on the top and bottom ceramic substrates. Power from the device is dissipated in two directions and the temperature rise is reduced approximately in half. The electrically isolated top and bottom surfaces eliminate the use of heat sink pads.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
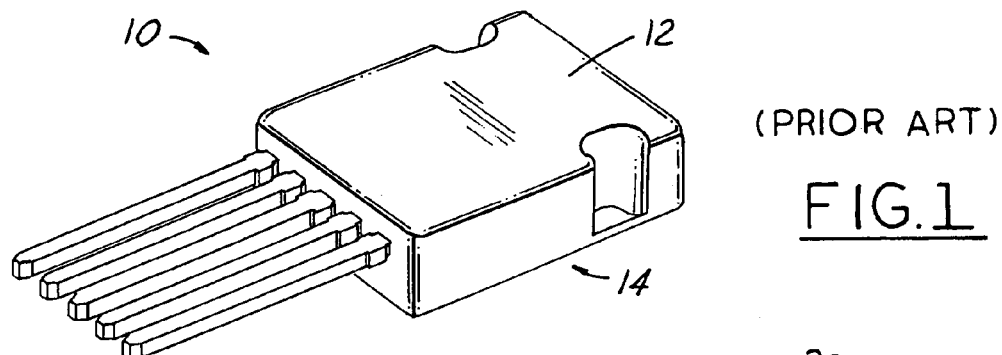
FIG. 1 illustrates a prior art TO220 package component.

A known TO220 package component device is shown in FIG. 1 and referred to generally by the reference numeral 10. The connector 10 has a plastic overmold covering 12, which covers the entire device except for the bottom surface (not shown but referred to by the reference numeral 14). The uncovered lower surface can provide a thermal and electrical path out of the package 10. This path also allows the use of a heat sinking mass or an electrical bus. If a heat sink pad is added to achieve electrical isolation, the pad adds thermal resistance to the assembly, typically on the order of 0.1 to 0.5° C./watt.

TO220 devices are pre-packaged integrated circuit (IC) components for use with printed circuit boards. The pre-packaged devices include transistors, diodes, resistors, and other internal components depending on the particular circuit and use desired. The leads or lead frames are attached to the circuit boards preferably by soldering. Many current TO 220-type devices utilize wire leads and wire bonds. Wire bonds crowd or concentrate the current and generate heat. Wire bonds also limit the current density of the device.

Figure 2:
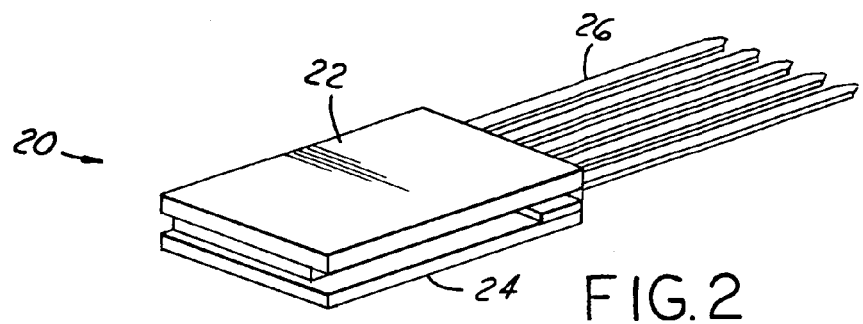
FIG. 2 illustrates a packaged component in accordance with the present invention.
Figure 3A:
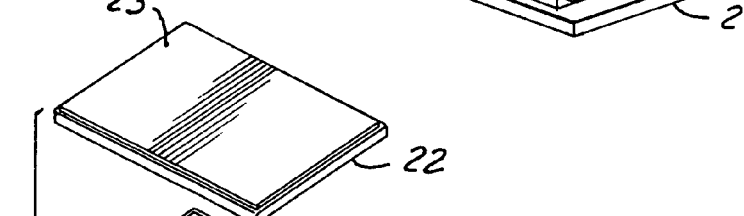
FIGS. 3A and 3B are exploded views of the component device shown in FIG. 2, with FIG. 3A showing the exploded view in one direction and FIG. 3B showing the exploded view in the opposite direction.
Figure 3B:
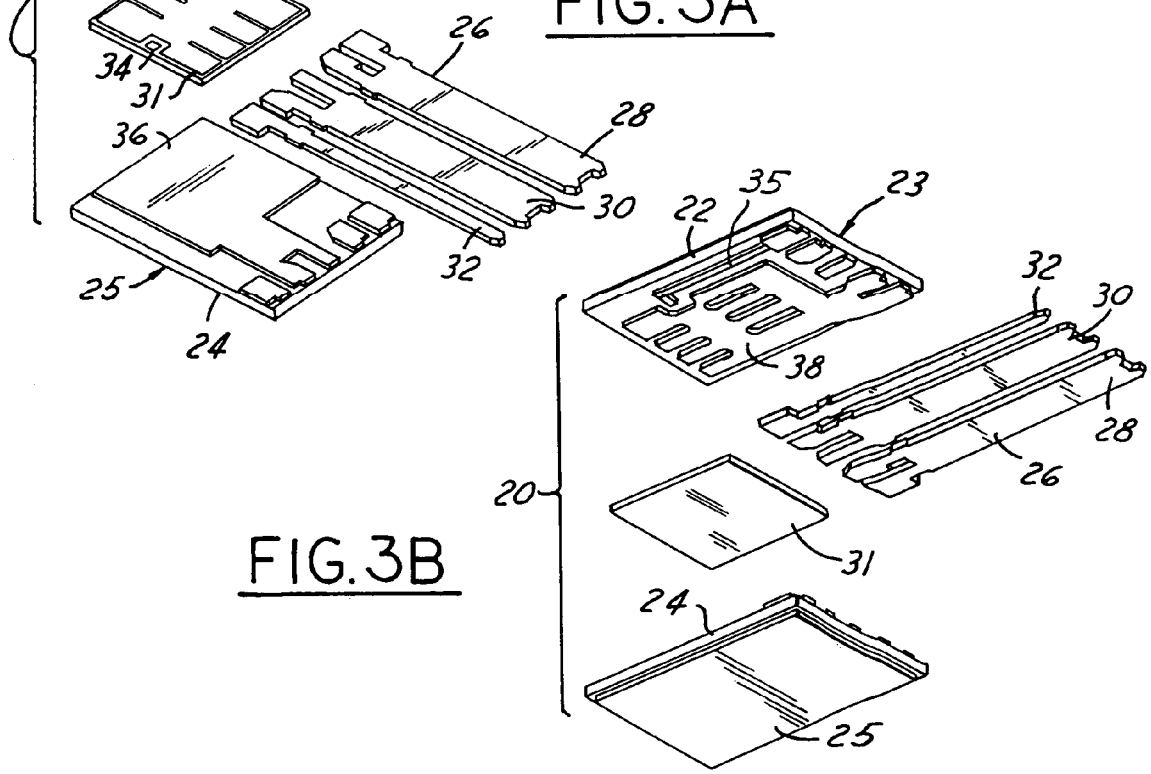

An embodiment of the present invention is shown in FIG. 2 and indicated in general by the reference numeral 20. FIGS. 3A and 3B are exploded views of the device 20 showing the components in opposite directions.

The device 20 has a pair of ceramic substrate members 22 and 24. The ceramic material can be any of the ceramic materials commonly used today, but preferably is either alumina ($Al_2O_3$), aluminum nitride (AlN), silicon nitride (SiN) or beryllium oxide (BeO). These ceramic substrates vary in thermal performance so the selection of the particular ceramic material to be utilized typically depends on the thermal requirements of the specific application.

The device 20 also includes a lead frame 26, which typically is comprised of a stamped copper material. The lead frame 26 typically has a plurality of connector members, including a source member 28, a drain member 30, and a gate member 32. The source member 28, drain member 30, and gate member 32 are used to connect the device 20 to an electrical bus or other device utilized in the particular application. The lead frames 26 are particularly used in high current applications (e.g. 200 amperes). For lower current applications individual lead pins can be utilized, as shown in FIGS. 4A–4B and 5A–5B.

The device 20 also includes a transistor, such as a MOSFET (metal oxide semiconductor field effect transistor) or an IGBT (isolated gate bipolar transistor) 31 which is positioned between the two substrates 22 and 24 and electrically connected to the members in the lead frame 26.

The drain member 30 is soldered and thus mechanically connected to the top and bottom substrate members 22 and 24. The drain member 30 is electrically connected to the drain pad 36 only. The source member 28 is similarly soldered and mechanically connected to the to and bottom substrate members 22 and 24. The source member 28 is electrically connected to the source pad 38 only. The gate pin or member 32 is soldered to gate runner 35 which is electrically connected to the gate 34 in the MOSFET 31.

Each of the ceramic substrates 22 and 24 can include a layer of solderable material 23 and 25 on the outer surfaces thereof. Pressure attached applications may not require solderable material 23 and 25 on the outer surface. Elimination of layers of solderable material 23 and 25 reduces the thermal resistance and device temperature.

Figure 4B:
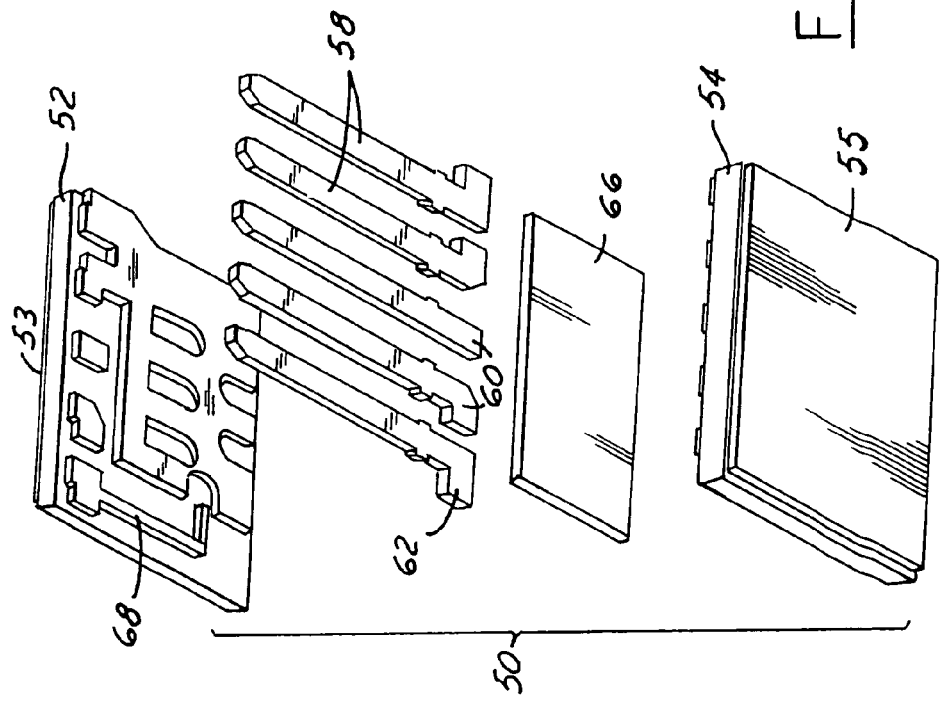
FIGS. 4A and 4B are exploded views of an alternate embodiment of the present invention.
Figure 4A:
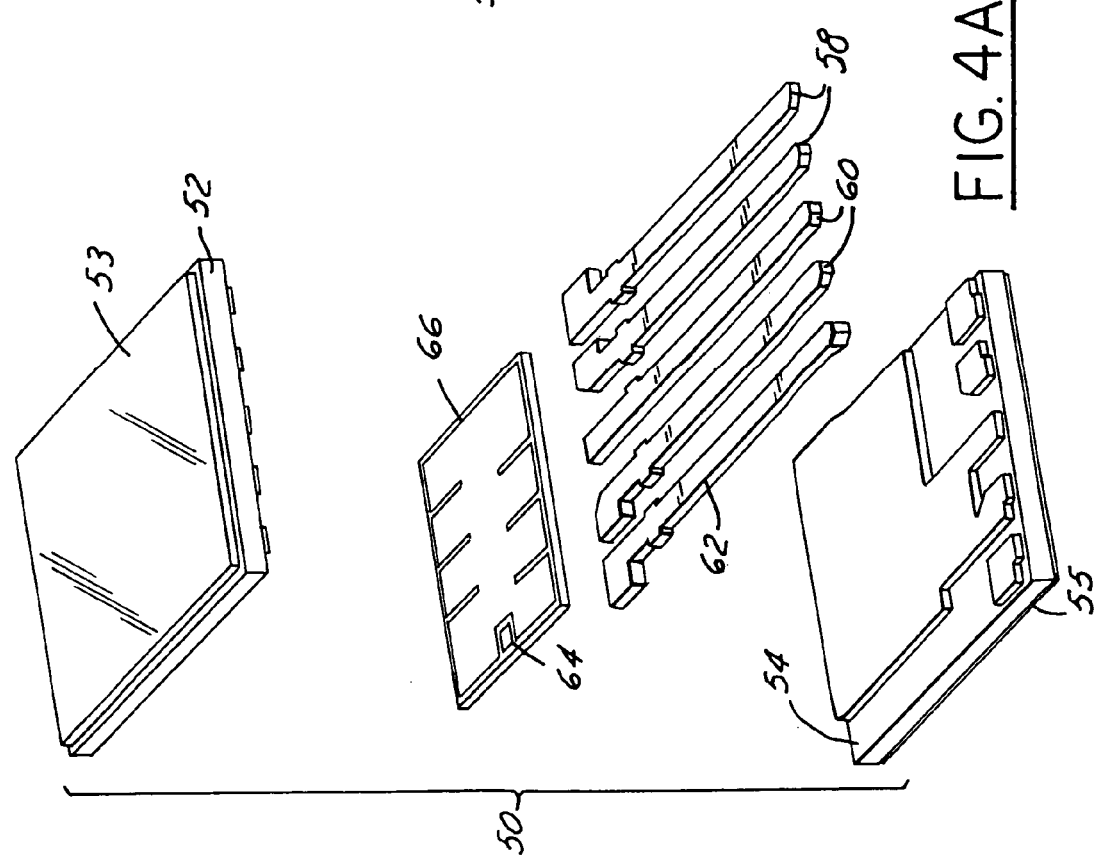
Figure 5A:
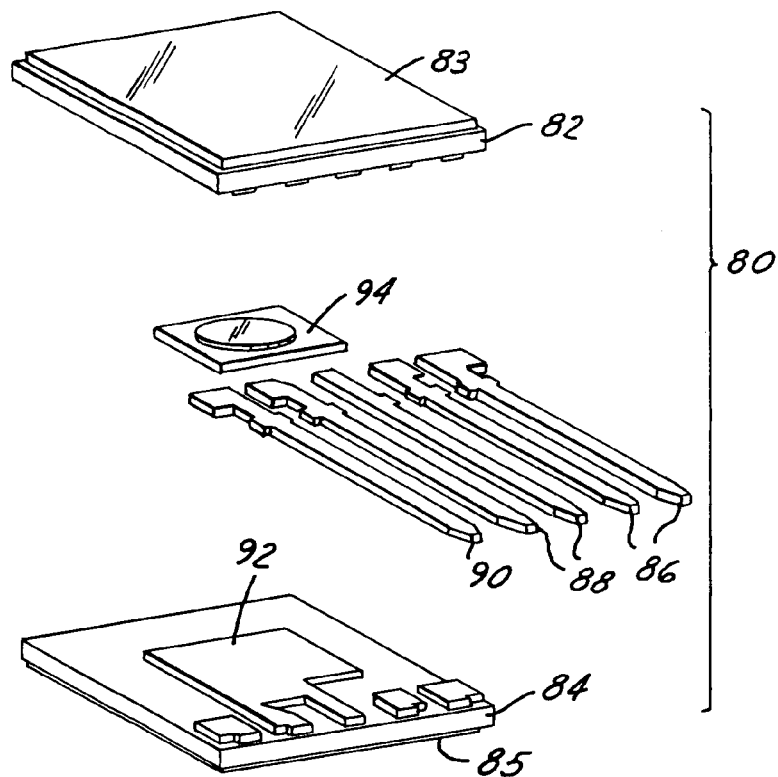
FIGS. 5A and 5B are exploded views of still another embodiment of the present invention.
Figure 5B:
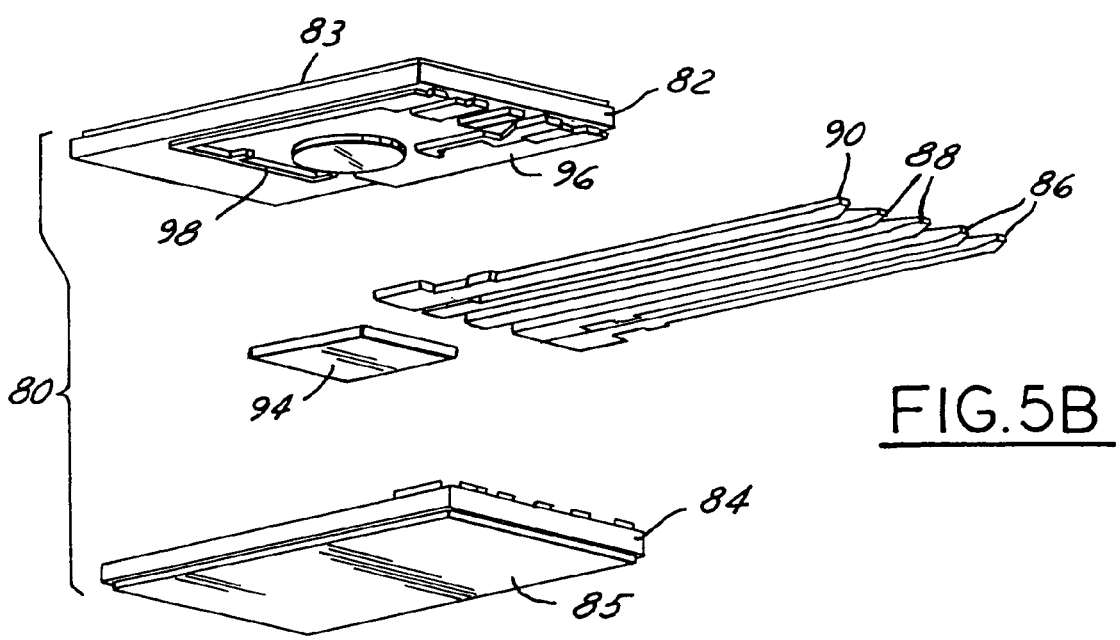

Other embodiments of the invention are shown in FIGS. 4A–4B and 5A–5B. The component device 50, as shown in FIGS. 4A–4B, includes upper and lower ceramic substrate members 52 and 54 which have direct bonded copper (DBC) solderable layers 53 and 55, respectively, positioned thereon. A pair of source pins 58, a pair of drain pins 60, and a gate pin 62 are positioned between the two substrate members 52 and 54 and protrude therefrom for electrical connection to the IC or bus bar. The gate pin 62 electrically connects with gate 64 in the MOSFET 66 by the gate runner 68. In the TO220-type component device shown in FIGS. 5A and 5B and indicated by the reference numeral 80, a pair of ceramic substrate members 82 and 84 is provided. Each of the substrates has a solderable surface or substrate secured thereon, the solderable substrates being identified by the reference numerals 83 and 85. The lead member includes a pair of source pins 86, a pair of drain pins 88, and a gate pin 90. One end of the pins 86, 88, and 90 is positioned between the two substrate members 82 and 84 when the device 80 is assembled and soldered together. The device 80 also includes a drain pad 92, which is positioned on ceramic substrate member 84, a MOSFET 94 and a source pad 96 positioned on the ceramic substrate member 82.

A gate runner 98 connects the gate pin 90 to the gate on the MOSFET 94. The MOSFET can have a number of gates, even though only one is used (the others are redundant). The extra gates allow design flexibility, provide the ability to use another gate if the one being utilized were to fail, and allows the device to be self-aligning during assembly.

As noted above with reference to FIGS. 3A–3B, 4A–4B, and 5A–5B, the configuration of the lead frame pins, MOSFET, gate runner and the like will change to match the geometry of the integrated circuits utilized with the device.

With the present invention, power can be dissipated in two directions from the IC component device, either up through the substrate on the upper surface of the device, or down through the base substrate. Utilization of a double-sided package reduces the temperature rise of the device approximately in one-half.

The solderable top, and bottom substrates on the device also are isolated from the integrated circuits and pins by the ceramic substrate members. By providing electrically isolated top and bottom surfaces, the use of heat sink pads are eliminated. Heat sink pads are expensive to acquire and utilize in a device and also add thermal resistance to the device oil the order of 0.1 to 0.5° C./watt.

The present invention is not limited to TO220-type devices. It can be used, for example, with devices having larger substrates and "footprints," such as super TO220 devices, TO247 devices and SO devices. The invention also has use in both single inline package devices (SIPS) and dual inline package devices (DIPS).

The present inventive devices have the ability to carry higher currents with less temperature rise than conventional wire bonded and strap bonded devices. The inventive devices conduct current and uniformly extract current across the entire face, not just at certain wire bond connection sites.

The present invention also has better durability and fatigue strength. The lower coefficient of expansion results in less movement during temperature cycling leading to longer durability and greater strength.

The use of multiple wire bonds is eliminated which saves manufacturing cycle time and material. The use of a plastic overmold is also eliminated. Due to the present invention, the change to different configurations can be done relatively easily and inexpensively.

The use of lead pins and lead frames also provides for improved processing and manufacturing of the devices. The copper lead member can be stamped and plated. The assembly can be inline with other high volume hybrid components.

While particular embodiments of the invention have been shown and described, numerous variations and alternate embodiments will occur to those skilled in the art. Accordingly, it is intended that the invention be limited only in terms of the appended claims.

What is claimed is:

1. A pre-packaged component device comprising:
   a first non-conductive substrate member having an outer surface;
   a second non-conductive substrate member having an outer surface, said first and second substrate members being formed from a ceramic material and disposed in a spaced, substantially parallel relationship, with said surfaces opposing one another;
   a first layer of solderable electrically conductive copper material direct bonded to the outer surface of said first substrate member;
   a second layer of solderable electrically conductive copper material direct bonded to the outer surface of said second substrate member;
   lead members and a metal oxide semiconductor field effect transistor (MOSFET) positioned between said first and second non-conductive substrate members, said MOSFET having at least one gate, said lead members stamped from copper material during manufacture and comprising a gate pin, a drain member and a source member;
   a drain pad positioned on an inside surface of said first non-conductive substrate member facing said second non-conductive substrate member;
   a source pad and a gate runner positioned on an inside surface of said second non-conductive substrate member facing said first non-conductive substrate member.

2. The component device as recited in claim 1 wherein said component device is a high current, high power device.

3. The component device as recited in claim 1 wherein said component device is a power diode with no gate lead.

4. The component device as recited in claim 1 wherein said component devices carry higher current densities than conventional devices.

5. The component device as recited in claim 1 wherein said ceramic material is taken from the group consisting of alumina, aluminum nitride, silicon nitride, and beryllium oxide.

* * * * *